(12) United States Patent
Linder et al.

(10) Patent No.: US 7,042,013 B2
(45) Date of Patent: May 9, 2006

(54) RADIATION-EMITTING SEMICONDUCTOR COMPONENT

(75) Inventors: Norbert Linder, Wenzenbach (DE); Peter Stauss, Pettendorf (DE); Mark Hampel, Regensburg (DE); Klaus Streubel, Laaber (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 17 days.

(21) Appl. No.: 10/647,000

(22) Filed: Aug. 22, 2003

(65) Prior Publication Data

US 2004/0135165 A1 Jul. 15, 2004

(30) Foreign Application Priority Data

Aug. 22, 2002 (DE) .......................... 102 38 524
Feb. 14, 2003 (DE) .......................... 103 06 311

(51) Int. Cl.
*H01L 27/15* (2006.01)

(52) U.S. Cl. ..................... 257/79; 257/86; 257/102; 257/103

(58) Field of Classification Search ............ 257/79, 257/86, 102–103
See application file for complete search history.

(56) References Cited

U.S. PATENT DOCUMENTS

| 5,282,218 | A | * | 1/1994 | Okajima et al. ............... 372/46 |
| 5,696,389 | A | * | 12/1997 | Ishikawa et al. ............... 257/99 |
| 6,265,732 | B1 | * | 7/2001 | Nakatsu et al. ............... 257/86 |
| 6,608,328 | B1 | * | 8/2003 | Kuo et al. ..................... 257/79 |
| 2004/0021142 | A1 | * | 2/2004 | Kuo ............................. 257/79 |

FOREIGN PATENT DOCUMENTS

| DE | 199 57 312 A1 | 7/2001 |
| JP | 10-209573 A | 8/1998 |
| JP | 11-68150 | 3/1999 |

OTHER PUBLICATIONS

Winterhoff, R., "Kurzwellige GanIP–Quantenfilmlaser: Epitaxie und Charakterisierung", Shaker Verlag GmbH, Aachen 1999, ISBN 3–82654958–9 pp. 96–99.

* cited by examiner

*Primary Examiner*—Luan Thai
(74) *Attorney, Agent, or Firm*—Cohen, Pontani, Lieberman & Pavane

(57) ABSTRACT

A radiation-emitting semiconductor component having a layer structure which contains an n-doped cladding layer (18), a p-doped cladding layer (20), and an active layer (14) based on InGaAlP arranged between the n-doped cladding layer (18) and the p-doped cladding layer (20). A diffusion stop layer (16) is arranged between the active layer (14) and the p-doped cladding layer (20). The diffusion stop layer (16) is formed by a strained superlattice.

16 Claims, 1 Drawing Sheet

RADIATION-EMITTING SEMICONDUCTOR COMPONENT

FIELD OF THE INVENTION

The invention relates to a radiation-emitting semiconductor component having a layer structure which contains an n-doped cladding layer, a p-doped cladding layer, an active layer based on InGaAlP arranged between the n-doped cladding layer and the p-doped cladding layer, and a diffusion stop layer arranged between the active layer and the p-doped cladding layer.

In this case, the materials based on InGaAlP include all mixed crystals with a composition which comes under the formula $In_x(Ga_yAl_{1-y})_{1-x}P$, where $0 \leq x \leq 1$, $0 \leq y \leq 1$. The InGaAlP-based semiconductor chips which emit electromagnetic radiation include all semiconductor chips in which the semiconductor layer sequence which contains a layer that generates electromagnetic radiation has, at least to a significant proportion, material based on InGaAlP and the properties of the radiation emitted by the semiconductor chip are at least substantially determined by the material based on InGaAlP. In this case, this material based on InGaAlP need not necessarily have a mathematically exact composition according to the above formula. However, it may have one or more dopants and also additional constituents.

BACKGROUND OF THE INVENTION

Light-emitting diodes based on InGaAlP can be produced by variation of the Al proportion with emission in a wide spectral range from red to yellow-green. By changing the Al content, the band gap of the InGaAlP system can be tuned from 1.9 eV to 2.2 eV.

During the operation of such light-emitting diodes, a decrease in the light power is observed depending on the operating conditions. The intentionally introduced magnesium doping of the p-type cladding layer is regarded as the principle cause of this aging. In this case, even during the epitaxy process when growing a GaP window layer, which is carried out at high temperatures, diffusion of the Mg doping atoms along the concentration gradient toward the active layer may occur.

Aging phenomena also occur during the operation of the light-emitting diodes.

One approach for combating the aging problem is to reduce the diffusion of the Mg doping atoms from the p-doped cladding layer into the active layer. With regard to the longest possible lifetime of the light-emitting diodes, it is desirable to prevent the magnesium diffusion to the greatest possible extent.

SUMMARY OF THE INVENTION

It is an object of the invention to provide a radiation-emitting semiconductor component of the generic type which has improved aging properties.

This and other objects are attained in accordance with one aspect of the invention directed to a radiation-emitting semiconductor component having a layer structure which contains an n-doped cladding layer, a p-doped cladding layer, an active layer based on InGaAlP arranged between the n-doped cladding layer and the p-doped cladding layer, and a diffusion stop layer arranged between the active layer and the p-doped cladding layer, wherein the diffusion stop layer has a strained superlattice.

It has surprisingly been found that a strained superlattice suppresses the diffusion of p-type dopant atoms to a significantly greater extent than with the use of conventional diffusion stop layers.

In a preferred embodiment of the invention, it is provided that the diffusion stop layer is formed by a superlattice which is alternately tensile/compressively strained. This leads to a particularly efficient suppression of the dopant diffusion through the stop layer.

In particular, it may advantageously be provided that the superlattice of the diffusion stop layer has N periods of tensile-strained $Inx(Ga_yAl_{1-y})_{1-x}P$ layers, where $0 \leq x \leq 1$, $0 \leq y \leq 1$, and compressively strained $In_x(Ga_yAl_{1-y})_{1-x}P$ layers, where $0 \leq x \leq 1$, $0 \leq y \leq 1$, N lying between 2 and 40, in particular between 5 and 20, preferably between 8 and 15. In a particularly preferred refinement, N is equal to 10, for example. The layers of the superlattice furthermore preferably have the same composition.

In an advantageous refinement of the component according to the invention, the superlattice of the diffusion stop layer consists of $In_xAl_{1-x}P$ layers (where $0 \leq x \leq 1$).

In the above connection, it has been found to be useful if the strain lies in the range of 0.1% to 5%, preferably in the range of 0.5% to 2%, particularly preferably in the range of 0.7% to 1%.

The invention provides particularly great advantages if the p-doped cladding layer is p-doped with magnesium.

In an expedient embodiment of the radiation-emitting semiconductor component, the diffusion stop layer is highly n-doped. The two layer types of the superlattice are preferably provided with a dopant concentration above $0.5 \times 10^{18}$ cm$^{-3}$. The dopant concentration particularly preferably lies in the range between 0.75 and $1.5 \times 10^{18}$ cm$^{-3}$, wherein the limits are included.

In this case, an n-type doping with tellurium has been found to be advantageous, in particular. The tellurium doping peak pinned by the superlattice then serves as an effective diffusion stop for the p-type dopant atoms.

In a preferred refinement, a transparent coupling-out layer is arranged on the topmost cladding layer of the layer structure. In particular the transparent coupling-out layer may essentially consist of GaP. Said coupling-out layer is typically deposited epitaxially using phosphine (PH$_3$) for one to two hours at a temperature of above 800° C. The high temperatures that are necessary promote the diffusion of dopant atoms from the p-doped cladding layer into the active layer.

The active layer may be formed for example by a p-n junction, a single quantum well structure or a multiple quantum well structure.

Further advantageous refinements, features and details of the invention are given in the dependent claims, the description of the exemplary embodiment and the drawings.

BRIEF DESCRIPTION OF THE DRAWINGS

The invention is explained in more detail below using an exemplary embodiment in connection with the drawing. Only the elements essential for understanding the invention are illustrated in each case. In the figures.

DETAILED DESCRIPTION OF THE DRAWINGS

Figure 1:
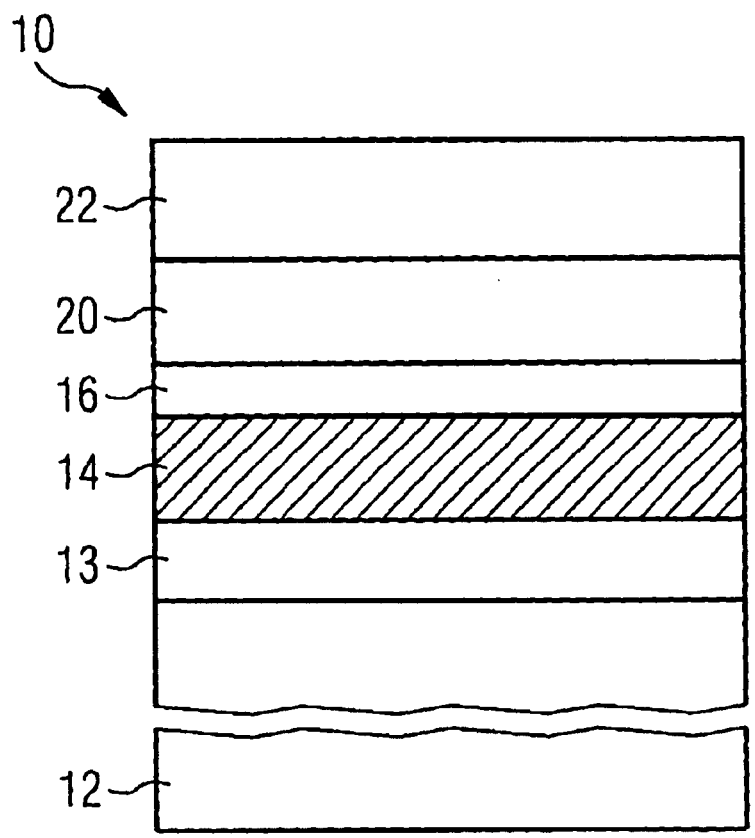
FIG. 1 shows a diagrammatic illustration of a sectional view of a radiation-emitting semiconductor component according to an exemplary embodiment of the invention.

FIG. 1 shows a diagrammatic illustration of a sectional view of an InGaAlP light-emitting diode, designated generally by 10, according to an exemplary embodiment of the invention. In this case, only the layers essential for understanding the invention are illustrated in the diagrammatic illustration of FIG. 1. It goes without saying, however, that further layers, such as, for instance, buffer layers, intermediate layers, ramps and the like, may likewise be present.

In the InGaAlP light-emitting diodes 10 an InGaAlP-based layer sequence is grown on an Si-doped GaAs substrate 12, said layer sequence containing an n-doped cladding layer 18, an active layer 14 and a cladding layer 20 p-doped with magnesium. A GaP window layer 22 has also been grown on the p-type cladding layer 20 during the epitaxy process at 840–860° C.

In order to suppress the diffusion of Mg doping atoms from the p-type cladding layer 20 into the active layer 14, which otherwise occurs at the high growth temperatures for the GaP window layer 22, a diffusion stop layer 16 is introduced between the active layer 14 and the p-type cladding layer 20. In the exemplary embodiment, the diffusion stop layer 16 consists of a highly n-doped strained superlattice.

Figure 2:
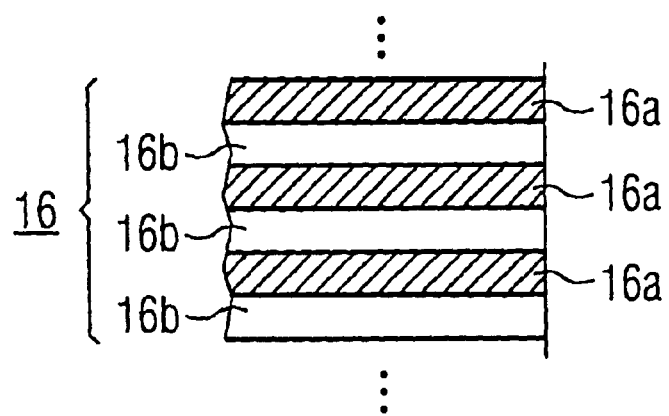
FIG. 2 shows a detail from the illustration of FIG. 1.

As can best be seen in the illustration of FIG. 2 the superlattice of the diffusion stop layer 16 consists of an alternating sequence of tensile-strained InAlP layers 16a each of them having a thickness of 4 nm and compressively strained InAlP layers 16b likewise each of them having a thickness of 4 nm. In the exemplary embodiment, the superlattice contains N=10 layer pairs 16a, 16b of this type.

The dots above and below the layers in FIG. 2 indicate that the alternating sequence contains more than the six layers shown. The degree of strain is chosen to be 0.8% in each case for both layer types in the concrete exemplary embodiment.

Both layer types are highly n-doped with tellurium at a dopant concentration of $0.75 \times 10^{18}$ cm$^{-3}$ to $1.5 \times 10^{18}$ cm$^{-3}$. The tellurium dopant peak pinned by the superlattice then acts as an effective diffusion stop for the magnesium doping atoms from the p-type cladding layer 20.

In order to check the effect of the diffusion stop layer according to the invention, SIMS (Secondary Ion Mass Spectrometry) depth profiles of a light-emitting diode 10 according to the invention and of a comparison light-emitting diode without a diffusion stop layer were recorded. The Mg dopant concentration set for the p-type cladding layer is of identical magnitude in both cases and is about $5 \times 10^{17}$ cm$^{-3}$.

What is found in the case of the comparison light-emitting diode, proceeding from the p-type cladding layer, is a magnesium concentration above $1 \times 10^{17}$ cm$^{-3}$ which falls only in a shallow manner and thus projects far in to the light-generating layers.

By contrast, by the introduction of the described diffusion stop layer 16 in this region the diffusion of the Mg atoms is effectively stopped and any further penetration is suppressed. In the case of the light-emitting diode according to the invention, the Mg concentration in the region of the light-generating layers 14 lies below $1 \times 10^{16}$ cm$^{-3}$, and is thus at a value which is noncritical for the aging behavior of the light-emitting diode.

It goes without saying that the features of the invention which are disclosed in the above description, in the drawing and also in the claims may be essential to the realization of the invention both individually and in any desired combination.

The scope of protection of the invention is not limited to the examples given hereinabove. The invention is embodied in each novel characteristic and each combination of characteristics, which includes every combination of any features which are stated in the claims, even if this combination of features is not explicitly stated in the claims.

We claim:

1. A radiation-emitting semiconductor component having a layer structure, comprising:
   an n-doped cladding layer (18),
   a p-doped cladding layer (20),
   an active layer (14) based on InGaAlP arranged between the n-doped cladding layer (18) and the p-doped cladding layer (20), and
   a diffusion stop layer (16) arranged between the active layer (14) and the p-doped cladding layer (20), wherein the diffusion stop layer (16) has a strained superlattice and is highly n-doped.

2. The radiation-emitting semiconductor component as claimed in claim 1, wherein
   the diffusion stop layer (16) has a superlattice which is alternately tensile/compressively strained.

3. The radiation-emitting semiconductor component as claimed in claim 2, wherein the superlattice of the diffusion stop layer (16) has N periods of tensile-strained In$_x$(Ga$_y$Al$_{1-y}$)$_{1-x}$P layers (16a), where $0 \leq x \leq 1$, $0 \leq y \leq 1$, and compressively strained In$_x$(Ga$_y$Al$_{1-y}$)$_{1-x}$P layers (16b), where $0 \leq x \leq 1$, $0 \leq y \leq 1$, N lying between 2 and 40, preferably between 5 and 20, particularly preferably between 8 and 15.

4. The radiation-emitting semiconductor component as claimed in claim 3, wherein
   the superlattice of the diffusion stop layer (16) consists of InAlP layers.

5. The radiation-emitting semiconductor component as claimed in claim 4, wherein
   the strain lies in the range of 0.1% to 5%, preferably in the range of 0.5% to 2%, particularly preferably in the range of 0.7% to 1%.

6. The radiation-emitting semiconductor component as claimed in claim 4, wherein
   a transparent coupling-out layer (22), which preferably essentially consists of GaP, is arranged on the topmost cladding layer (20) of the layer structure.

7. The radiation-emitting semiconductor component as claimed in claim 3, wherein
   the strain lies in the range of 0.1% to 5%, preferably in the range of 0.5% to 2%, particularly preferably in the range of 0.7% to 1%.

8. The radiation-emitting semiconductor component as claimed in claim 3, wherein
   a transparent coupling-out layer (22), which preferably essentially consists of GaP, is arranged on the topmost cladding layer (20) of the layer structure.

9. The radiation-emitting semiconductor component as claimed in claim 2, wherein
   the strain lies in the range of 0.1% to 5%, preferably in the range of 0.5% to 2%, particularly preferably in the range of 0.7% to 1%.

10. The radiation-emitting semiconductor component as claimed in claim 1, wherein
    the strain lies in the range of 0.1% to 5%, preferably in the range of 0.5% to 2%, particularly preferably in the range of 0.7% to 1%.

11. The radiation-emitting semiconductor component as claimed in claim 1, wherein
    the p-doped cladding layer (20) is p-doped with magnesium.

12. The radiation-emitting semiconductor component as claimed in claim 1, wherein the diffusion stop layer (16) is n-doped with tellurium.

13. The radiation-emitting semiconductor component as claimed in claim 12, wherein the n-type dopant concentration lies above $0.5 \times 10^{18}$ cm$^{-3}$, in particular between $0.75 \times 10^{18}$ cm$^{-3}$ and $1.5 \times 10^{18}$ cm$^{-3}$ (limits included).

14. The radiation-emitting semiconductor component as claimed in claim 1, wherein the n-type dopant concentration lies above $0.5 \times 10^{18}$ cm$^{-3}$, in particular between them and including 0.75 and up to and including $1.5 \times 10^{18}$ cm$^{-3}$.

15. The radiation-emitting semiconductor component as claimed in claim 1, wherein a transparent coupling-out layer (22), which preferably essentially consists of GaP, is arranged on the topmost cladding layer (20) of the layer structure.

16. The radiation-emitting semiconductor component as claimed in claim 1, wherein the active layer (14) comprises a p-n junction, a single quantum well structure or a multiple quantum well structure.

* * * * *

UNITED STATES PATENT AND TRADEMARK OFFICE
CERTIFICATE OF CORRECTION

| | |
|---|---|
| PATENT NO. | : 7,042,013 B2 |
| APPLICATION NO. | : 10/647000 |
| DATED | : May 9, 2006 |
| INVENTOR(S) | : Norbert Linder et al. |

Page 1 of 1

It is certified that error appears in the above-identified patent and that said Letters Patent is hereby corrected as shown below:

On the Title page, Item (73) should read:

(73)   Assignee:   ~~Osram Opto Semiconductors GmbH, Regensburg (DE)~~

Osram GmbH, Munich (DE)

Signed and Sealed this
First Day of April, 2014

Michelle K. Lee
*Deputy Director of the United States Patent and Trademark Office*